US006482716B1

(12) United States Patent
Wohlfahrt

(10) Patent No.: US 6,482,716 B1
(45) Date of Patent: Nov. 19, 2002

(54) UNIFORM RECESS DEPTH OF RECESSED RESIST LAYERS IN TRENCH STRUCTURE

(75) Inventor: Joerg Wohlfahrt, Glen Allen, VA (US)

(73) Assignee: Infineon Technologies North America Corp., Cupertino, CA (US)

( * ) Notice: Subject to any disclaimer, the term of this patent is extended or adjusted under 35 U.S.C. 154(b) by 0 days.

(21) Appl. No.: 09/481,769

(22) Filed: Jan. 11, 2000

(51) Int. Cl.⁷ .............................................. H01L 21/76
(52) U.S. Cl. ...................................... 438/427; 438/435
(58) Field of Search ............................. 438/424, 435, 438/437, 386, 387

(56) References Cited

U.S. PATENT DOCUMENTS

| 4,001,465 A | | 1/1977 | Graul et al. ................ 148/187 |
|---|---|---|---|
| 4,568,601 A | * | 2/1986 | Araps et al. ................ 428/167 |
| 4,599,136 A | * | 7/1986 | Araps et al. ................ 438/424 |
| 4,665,007 A | * | 5/1987 | Cservak et al. ............. 430/311 |
| 5,099,304 A | * | 3/1992 | Takemura et al. ........... 257/647 |
| 5,437,762 A | | 8/1995 | Ochiai et al. ................. 216/20 |
| 5,492,858 A | | 2/1996 | Bose et al. .................... 437/67 |
| 5,618,751 A | | 4/1997 | Golden et al. ............... 438/392 |
| 5,665,633 A | * | 9/1997 | Meyer ......................... 438/427 |
| 5,683,945 A | | 11/1997 | Penner et al. ................ 437/225 |
| 6,022,789 A | * | 2/2000 | Takase ........................ 438/431 |

OTHER PUBLICATIONS

D.J. Sheldon et al., Application of a Two–layer Planarization Process to VLSI Intermetal Dielectric and Trench Isolation Processes. 1988 IEEE, pp. 140–146.*

* cited by examiner

*Primary Examiner*—Olik Chaudhuri
*Assistant Examiner*—Anh Duy Mai

(57) ABSTRACT

A method for forming uniform-depth recesses across areas of different trench density, in accordance with the present invention, includes providing a substrate having trenches formed therein. The substrate includes regions of different trench density. The trenches are filled with a first filler material, and the first filler material is removed from a surface of the substrate. A second filler material is formed over the surface of the substrate such that the depth of the second filler material is substantially uniform across the regions of different trench density. Recesses are formed in the trenches such that the recess depth below the surface of the substrate is substantially uniform across the regions

10 Claims, 2 Drawing Sheets

UNIFORM RECESS DEPTH OF RECESSED RESIST LAYERS IN TRENCH STRUCTURE

BACKGROUND

1. Technical Field

This disclosure relates to semiconductor processing and more particularly, to a semiconductor fabrication method which improves uniformity of recess depths among areas of different trench densities.

2. Description of the Related Art

Semiconductor devices may include trenches formed in semiconductor substrates. These trenches may be filled with a resist material during processing. The resist material may be recessed into the trenches to enable the formation of other structures for the semiconductor devices. Trenches may vary in density across a semiconductor device. For example, some areas of the device may include more trenches in a given area than the number of trenches in another area. The different trench densities often result in non-uniformity of the recess depth of recessed resist layers over areas of different trench densities.

The different trench densities within an area of a semiconductor wafer may lead to a varying thickness of layers deposited on the wafer (for example, due to the volume effect of the trenches). If these layers need to be recessed into the trenches, the different thickness of the deposited layer over areas of high or low trench density leads to different recess etch depths in the trenches. Areas with a high trench density will be recessed deeper into the trenches than areas with a lower trench density, where the deposited layer is thicker.

Therefore, a need exists for a method for recessing trench filler materials which compensates for different trench densities to obtain a substantially even recess depth across the different trench densities.

SUMMARY OF THE INVENTION

A method for forming uniform-depth recesses across areas of different trench density, in accordance with the present invention, includes providing a substrate having trenches formed therein. The substrate includes regions of different trench density. The trenches are filled with a first filler material, and the first filler material is removed from a surface of the substrate. A second filler material is formed over the surface of the substrate such that the depth of the second filler material is substantially uniform across the regions of different trench density. Recesses are formed in the trenches such that the recess depth below the surface of the substrate is substantially uniform across the regions of different trench density.

Another method for forming uniform-depth recesses across areas of different trench density includes providing a substrate having trenches formed therein. The substrate includes at least two regions. Each of the at least two regions has a different trench density. A first filler material is formed over the substrate, and the first filler material fills the trenches in the at least two regions. The first filler material has a depth above the substrate which is a function of the different trench densities. The first filler material is etched to substantially remove the first filler material from a surface of the substrate while leaving the trenches substantially filled with the first filler material. A second filler material is formed over the substrate. The trenches are refilled in the at least two regions. The second filler material has a depth above the substrate which is substantially uniform across the different trench densities of the at least two regions. The first and second filler materials are etched to form recesses in the trenches, and the recesses have a substantially same depth across the different trench densities of the at least two regions.

In other methods of the invention, the first filler material and the second filler material may have a same etch rate. The first filler material and the second filler may include the same material. The first filler material and the second filler may include a resist material. The step of removing the first filler material from a surface of the substrate may include the step of etching the first filler material to form a recess in trenches in a region having a highest density of trenches. The step of removing the first filler material may include etching the first filler material by employing one of an isotropic etching, anisotropic etching and a development process. The step of forming recesses in the trenches may include etching the first and second filler materials by employing one of an isotropic etching, anisotropic etching and a development process. The step of providing a substrate having trenches formed therein may include providing a monocrystalline substrate including regions of different trench density. The step of providing a substrate having trenches formed therein may include providing a dielectric layer including regions of different trench density. The step of providing a substrate having trenches formed therein, the substrate including regions of different trench density may include the step of providing an array region having a first density of trenches and a support region having a second density of trenches.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a semiconductor fabrication method which improves uniformity of recess depths among areas of different trench densities. In one embodiment, trench densities vary across different areas of a chip. For example, memory chip may include an array area having a first trench density and (e.g. a high trench density and a support area having a second trench density (e.g. a low trench density). Recess depths of filler materials can vary among these different areas. The present invention provides a method for maintaining a relatively equal recess depth among the trenches in areas having different trench densities.

Figure 1:
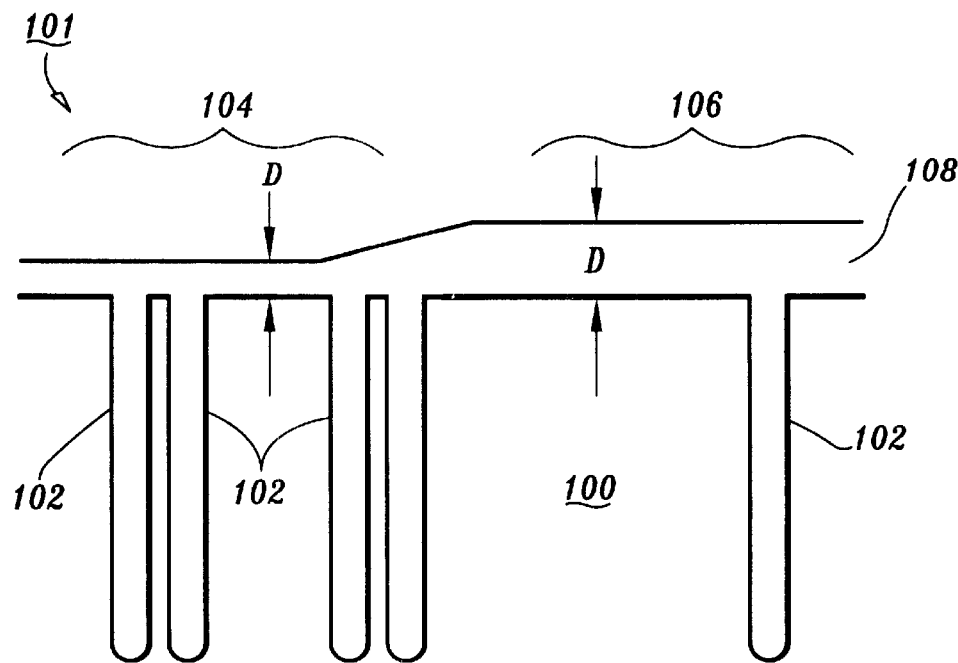
FIG. 1 is a cross-sectional view of a semiconductor device having a first filler material deposited thereon to fill trenches in areas of different trench density in accordance with the present invention.

Referring now in specific detail to the drawings in which like reference numerals identify similar or identical elements throughout the several views, and initially to FIG. 1, a partial cross-sectional view of a semiconductor device 101 is shown. Semiconductor device 101 may include a memory chip, such as, a static random access memory (SRAM) chip, a dynamic random access memory (DRAM) chip or an embedded memory chip including a logic region and a memory region. Semiconductor device 101 may also include a processing chip or an application specific integrated circuit (ASIC) chip or other semiconductor device having trenches formed thereon.

A substrate 100 is shown having trenches 102 formed therein. Substrate 100 may include a monocrystalline substrate, such as a silicon substrate or include a dielectric layer, such as an oxide or nitride layer. Trenches 102 may include deep trenches which includes a single hole in substrate 100. Trenches 102 may include an extended trench which extends longitudinally into or out of the page as shown in FIG. 1. Substrate 100 includes two regions. A first region 104 includes trenches 102 having a high density, and a second region 106 include trenches 102 having a low or lower density than first region 104.

A filler material 108 is deposited over substrate 102 and fills trenches 102. As shown in FIG. 1, filler material 108 includes a varying depth profile. In other words depth D varies over a surface 110 of substrate 102. This is due to the density of trenches 102. Region 104 (higher density) includes a smaller depth D of filler material 108 than region 106 (lower density). This is due to the volume compensation effect, which provides a given volume of material to a given area of a chip. More of this volume is consumed by filling the greater number of trenches in region 104.

In a preferred embodiment, filler material 108 includes a resist material, for example, IX420 available from JSR, Inc., IP3250, available from TOK, I-line or DUV resists. Other resist materials are also contemplated. Other materials may be used for filler material 108 as well. For example, polysilicon, plasma-enhanced chemical vapor deposited nitride or other materials having selectivity against the substance on which they are formed. These other materials depend on the application for the semiconductor device and/or the function of the trenches. If resist is employed for filler material 108 a baking step is performed to prepare filler material for etching as will be described below.

Figure 2:
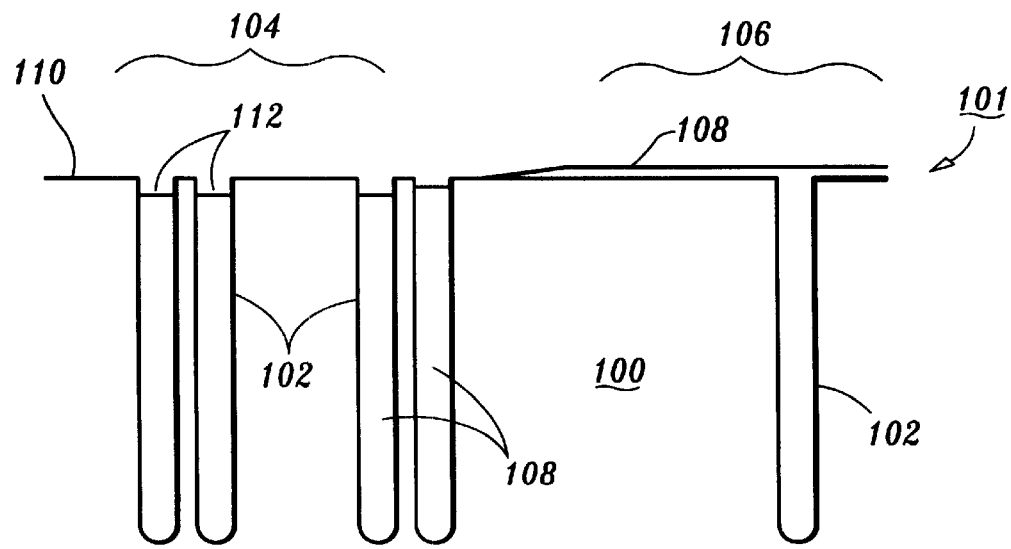
FIG. 2 is a cross-sectional view of the semiconductor device of FIG. 1 having the first filler material substantially removed from a surface of a substrate across the areas of different trench density in accordance with the present invention.

Referring to FIG. 2, an etching process is performed to remove a portion of filler material 108. In a preferred embodiment, filler material 108 is etched such that a recess 112 is formed in high density region 104. Recess 112 may illustratively include a depth of about 0.5 microns from surface 110 of substrate 100. In accordance with the present invention, most of a volume of trenches 102 remains filled by filler material 108 after the etching process. The etching process may include isotropic etching, anisotropic etching or development if resist is employed for filler material 108. The result of the etching process includes almost completely filled trenches in high trench density areas 104 and areas with lower trench density 106 may be covered with a thin layer 114 of filler material 108.

Figure 3:
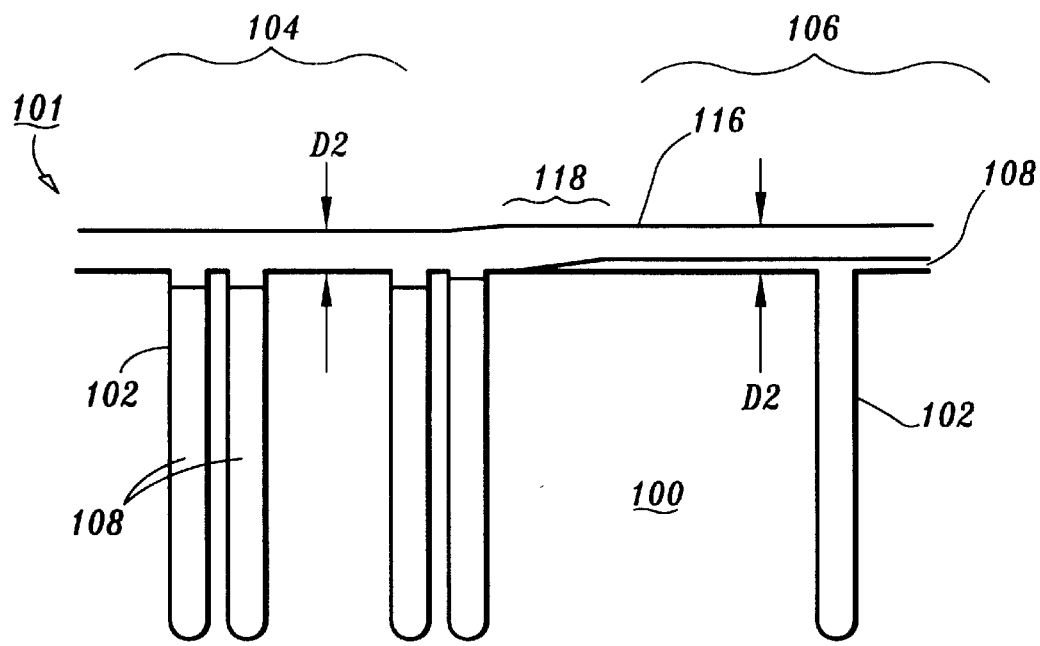
FIG. 3 is a cross-sectional view of the semiconductor device of FIG. 2 having a second filler material formed over the substrate across the areas of different trench density in accordance with the present invention.

Referring to FIG. 3, a second layer of filler material 116 is deposited over substrate 100, over filler material 108 and in trenches 102 to fill in recesses 112. A depth D2 of filler material 116 is substantially more uniform across areas 104 and 106 (areas of different trench densities). Depth D2 is substantially uniform due to the substantial filling of trenches 102 by filler layer 108. A step 118 between areas 104 and 106 is significantly less pronounced in accordance with the present invention. If filler layer 116 includes resist, the resist is baked to prepare the resist for etching in later steps as described below.

Figure 4:
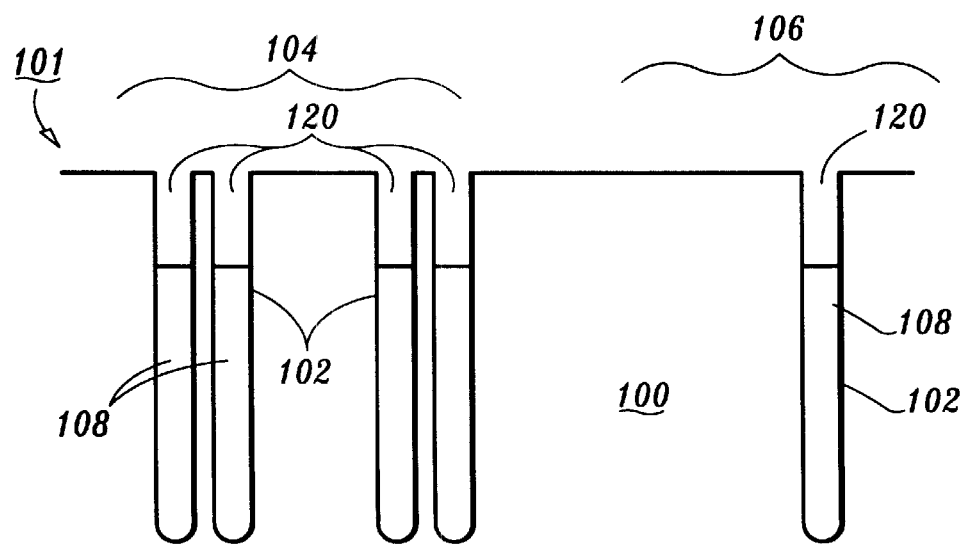
FIG. 4 is a cross-sectional view of the semiconductor device of FIG. 4 having the first filler material and the second filler material etched to form recesses in the filler material within the trenches, the recesses having a substantially uniform depth in accordance with the present invention.

Referring to FIG. 4, another etching process is performed to remove filler material 116 from a top portion of trenches 102. Filler material 116 is etched such that a recess 120 is formed in each trench 102 in both regions 104 and 106. Recesses 120 include a substantially uniform depth between trenches 102 in regions 104 and 106. The etching process may include isotropic etching, anisotropic etching or development if resist is employed for filler material 116. It should be noted that filler material 108 and filler material 116 are preferably the same material. However, materials for filler 108 and 116 may be different if the materials include a substantially same etch rate. The result of the second etching process includes trenches 102 areas 104 and 106 having substantially the same recess depth for recesses 120. Preferably the recess depths across are within ±0.05 microns of each other.

Having described preferred embodiments for uniform recess depth of recessed resist layers in trench structures (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

What is claimed is:

1. A method for forming uniform-depth recesses across areas of different trench density comprising the steps of:

providing a substrate having trenches formed therein, the substrate including at least two regions, each of the at least two regions having a different trench density, blanketing a first filler material layer over the substrate to a depth effective in filling the trenches in the at least two regions with first filler material, the first filler material layer having a depth above the substrate that is a function of the different trench densities;

etching the first filler material layer to substantially remove the first filler material from a surface of the substrate while leaving the trenches substantially filled with the first filler material while forming recesses in trenches in a region having a highest density of trenches;

forming a second filler material over the substrate, and refilling the trenches in the at least two regions, the second filler material having a depth above the substrate that is substantially uniform across the different trench densities of the at least two regions;

and etching the first and second filler materials to form recesses in the trenches, the recesses having a substantially same depth across the different trench densities of the at least two regions.

2. The method as recited in claim 1, wherein the first filler material and the second filler material have a same etch rate.

3. The method as recited in claim 1, wherein the first filler material and the second filler include the same material.

4. The method as recited in claim 1, wherein the first filler material and the second filler include a resist material.

5. The method as recited in claim 1, wherein the step of etching the first filler material includes etching the first filler material by employing one of an isotropic etching, anisotropic etching and a development process.

6. The method as recited in claim 1, wherein the step of etching the first and second filler materials to form recesses in the trenches includes etching the first and second filler materials by employing one of an isotropic etching, anisotropic etching and a development process.

7. The method as recited in claim 1, wherein the step of providing a substrate having trenches formed therein includes providing a monocrystalline substrate including regions of different trench density.

8. The method as recited in claim 1, wherein the step of providing a substrate having trenches formed therein includes providing a dielectric layer including regions of different trench density.

9. The method as recited in claim 1, wherein the at least two regions of different trench density include an array region having a first density of trenches and a support region having a second density of trenches.

10. The method of claim 1 wherein said recess depths across the different trench densities are substantially uniform to within one-half micron of one another.

* * * * *